(12) United States Patent
Moors et al.

(10) Patent No.: US 8,446,560 B2
(45) Date of Patent: May 21, 2013

(54) LITHOGRAPHIC APPARATUS COMPRISING A MAGNET, METHOD FOR THE PROTECTION OF A MAGNET IN A LITHOGRAPHIC APPARATUS AND DEVICE MANUFACTURING METHOD

(75) Inventors: Johannes Hubertus Josephina Moors, Helmond (NL); Norbertus Benedictus Koster, Delft (NL); Erik Roelo Loopstra, Eindhoven (NL); Martin Frans Pierre Smeets, Veldhoven (NL); Antonius Theodorus Wilhelmus Kempen, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 342 days.

(21) Appl. No.: 12/735,823

(22) PCT Filed: Feb. 19, 2009

(86) PCT No.: PCT/NL2009/050074
§ 371 (c)(1),
(2), (4) Date: Sep. 30, 2010

(87) PCT Pub. No.: WO2009/104962
PCT Pub. Date: Aug. 27, 2009

(65) Prior Publication Data
US 2011/0013157 A1    Jan. 20, 2011

Related U.S. Application Data

(60) Provisional application No. 61/064,165, filed on Feb. 20, 2008.

(51) Int. Cl.
*G03B 27/52* (2006.01)
*G03B 27/42* (2006.01)

(52) U.S. Cl.
USPC .............................................. 355/30; 355/53

(58) Field of Classification Search
USPC ........................... 355/30, 53; 250/492.2, 548
See application file for complete search history.

(56) References Cited

U.S. PATENT DOCUMENTS

| | | | | |
|---|---|---|---|---|
| 7,391,291 | B2 * | 6/2008 | Miyata | 335/302 |
| 7,875,864 | B2 * | 1/2011 | Sogard | 250/492.2 |
| 7,985,363 | B2 * | 7/2011 | Somple et al. | 264/263 |

(Continued)

FOREIGN PATENT DOCUMENTS

| EP | 1 712 955 A2 | 10/2006 |
|---|---|---|
| EP | 1 976 344 A2 | 10/2008 |
| WO | 2008/002134 A2 | 1/2008 |

OTHER PUBLICATIONS

International Search Report for International Application No. PCT/NL2009/050074 dated May 6, 2009.

*Primary Examiner* — Hung Henry Nguyen
(74) *Attorney, Agent, or Firm* — Pillsbury Winthrop Shaw Pittman LLP

(57) ABSTRACT

A lithographic apparatus includes a magnet being contained in a protective enclosure, the protective enclosure being arranged to protect the magnet from contact with a $H_2$-containing or H-atom containing gas. The enclosure may further contain a hydrogen getter, such as a magnet-surface modifying gas, or a non-hydrogen containing gas. A non-hydrogen containing gas flow may be provided or a non-hydrogen getter gas flow may be provided through at least part of the protective enclosure.

7 Claims, 3 Drawing Sheets

U.S. PATENT DOCUMENTS

2003/0076602 A1 4/2003 Nishikawa
2003/0197844 A1 10/2003 Mertens
2005/0008978 A1* 1/2005 Dams et al. .................. 430/322
2007/0145831 A1 6/2007 Dams

* cited by examiner

LITHOGRAPHIC APPARATUS COMPRISING A MAGNET, METHOD FOR THE PROTECTION OF A MAGNET IN A LITHOGRAPHIC APPARATUS AND DEVICE MANUFACTURING METHOD

CROSS-REFERENCE TO RELATED APPLICATIONS

This application claims the benefit of U.S. provisional application 61/064,165 which was filed on Feb. 20, 2008, and which is incorporated herein in its entirety by reference.

FIELD

The present invention relates to a lithographic apparatus comprising a magnet, to a method for the protection of a magnet in a lithographic apparatus and also to a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate may be limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector or collector mirror. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources may probably use tin (Sn) or another metal vapor to produce EUV radiation. This tin may leak into the lithographic apparatus, and may be deposited on mirrors in the lithographic apparatus, e.g. the mirrors of the radiation collector. The mirrors of such a radiation collector may have a EUV reflecting top layer of, for example, ruthenium (Ru). Deposition of more than approximately 10 nm tin (Sn) on the reflecting Ru layer may reflect EUV radiation in the same way as bulk Sn. The overall transmission of the collector may decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers or traps may remove part of the debris, still some debris may deposit on the radiation collector or other optical elements.

In order to remove debris, cleaning methods have been discussed, including for instance hydrogen radical cleaning, such as for instance described in International Patent Application Publication No. WO 2008/002134. In this way, $H_2$ and hydrogen radicals are introduced in at least part of the lithographic apparatus.

SUMMARY

Lithographic apparatus may comprise one or more magnets, which can be used for a plurality of applications, like the control of shutters, or the application in motors or actuators, to mount pieces to frames and stages, etc., see for instance United States Patent Application Publication No. 2007/0145831.

It is an aspect of the present invention to provide an alternative lithographic apparatus comprising a magnet. It is a further aspect of the invention to provide a method for the protection of a magnet in a lithographic apparatus. It is yet another further aspect of the invention to provide a device manufacturing method.

To that end, a lithographic apparatus may be provided comprising at least one chamber having an interior space; a magnet; and a protective enclosure, the magnet being contained in the protective enclosure and the protective enclosure being arranged to protect the magnet from contact with a hydrogen-containing gas present in the protective enclosure, wherein the hydrogen-containing gas comprises one or more gasses selected from the group consisting of a $H_2$-containing gas and a hydrogen-atom containing gas. Because hydrogen atoms and $H_2$ may attack magnets, especially magnets comprise rare earths such as Nd, Sm, La, etc., a protective enclosure arranged to protect the magnet from contact with a hydrogen-containing gas, that may be present in the lithographic apparatus, may provide a longer lifetime and/or better operation of the magnet (i.e. protect the magnet). The use of the enclosure may prevent or reduce attack by hydrogen atoms and $H_2$. The enclosure is especially arranged to protect contact of hydrogen-containing gasses that may be present in the interior space of the chamber of the lithographic apparatus with the magnet. Hence, the protective enclosure is especially arranged to exclude the magnet from the rest of the interior space of the chamber of the lithographic apparatus. The lithographic apparatus interior is herein also indicated as lithographic apparatus volume or protective enclosure exterior. In the lithographic apparatus $H_2$ pressures in the range of about 0.1-100 Pa may be applied. Further, hydrogen atoms (or hydrogen radicals) may be present, for instance in the course of cleaning processes (see for instance International Patent Application Publication No. WO 2008/002134).

Since even well closed enclosures may comprise or develop in time leaks or cracks, which may allow $H_2$ and/or hydrogen atoms present in the lithographic apparatus to enter the enclosure, the magnet may even be more protected by further using a hydrogen getter. In an embodiment, the protective enclosure further encloses a hydrogen getter. The hydrogen getter may for instance be a rare earth metal, such as Sm or La, or a noble metal, such as Pd, or a hydrocarbon that can be hydrogenated, or other getters for hydrogen known in the art. Herein, a hydrogen getter is a material that is able to bind hydrogen atoms and/or $H_2$, especially to a significant fraction of it's own mass, such as for instance in the range of 0.01-50 wt. %, especially 0.01-10 wt. %, relative to the unbound getter (i.e. relative to the getter not yet binding $H_2$ and/or H in the protective enclosure). Such getters are known in the art. In an embodiment, combinations of two or more getters may also be applied. The term "getter" refers to one or more selected from the group consisting of solid getters, such as Sm, La, etc., and/or gaseous getters and/or liquid getters, such as hydrocarbons that can be hydrogenated, such as ethene, propene, etc.

In an embodiment, by using a magnet-surface modifying gas, the magnet may alternatively or in addition be protected. For instance, the protective enclosure may enclose such a magnet-surface modifying gas. Suitable magnet-surface modifying gasses are $O_2$-containing gasses, such as $O_2$ or air, or water vapor. Such a magnet-surface modifying gas may be applied to modify the surface to such an extent, that the presence of $H_2$ or H may not be detrimental anymore. For instance, the magnet-surface modifying gas may physically form a protective coating but may also chemically form a protective coating. For instance, when using an $O_2$-containing gas, the surface of the magnet may as a result of the presence of the $O_2$ form an oxide coating, thereby effectively protecting the magnet for H and/or $H_2$. The oxygen in the protective enclosure may allow chemical reactions at the surface always in the direction of oxidation instead of hydrogenation. In an embodiment, the protective enclosure may further enclose a magnet-surface modifying gas.

Herein, the term "hydrogen-containing gas" refers to a gas comprising hydrogen molecules (i.e. $H_2$ and analogues thereof), also indicated as $H_2$-containing gas, and/or to a gas comprising hydrogen radicals (i.e. H and analogues thereof), also indicted as hydrogen-atom containing gas. Analogues of the hydrogen atom or hydrogen radical comprise D (deuterium) and T (tritium) and analogues of $H_2$ comprise $D_2$, $T_2$, HD, TD, HT. For the sake of simplicity, $H_2$ (including analogues thereof) and H (including analogues thereof) are further indicated as $H_2$ and H, respectively. Thus, $H_2$ may refer to one or more selected from the group consisting of $H_2$, $D_2$, $T_2$, HD, TD, HT, and H may refer to one or more selected from the group consisting of H, D and T.

Herein the terms "$H_2$-containing gas" or "$O_2$-containing gas" relate to gasses comprising or consisting of such molecules, like in the case of a $H_2$-containing gas diluted $H_2$, such a mixture of $H_2$ and one or more noble gasses, and in the case of the $O_2$-containing gas diluted $O_2$ (like air) or pure $O_2$. The term hydrogen-containing gas generally refers to a gas comprising hydrogen radicals and $H_2$.

In another embodiment, the magnet is maintained in a protective gas. This may be achieved by feeding a non-hydrogen containing gas into the protective enclosure. Hence, in an embodiment, the protective enclosure further comprises an inlet for a non-hydrogen containing gas and the lithographic apparatus may further comprise a controller arranged to control a predetermined pressure of the non-hydrogen containing gas in the protective enclosure. In this way, for instance the atmosphere within the protective enclosure can be maintained at a pressure which is higher than the pressure external from the protective enclosure. Thereby, leakage from $H_2$ gas or H radicals into the protective enclosure may be reduced or even prevented. Such a non-hydrogen containing gas may in an embodiment also comprise a magnet-surface modifying gas, as for instance described above. The ratio of the internal protective enclosure pressure to the pressure external from the protective enclosure may be larger than 1, such as in the range of 1.01-10,000, or in the range of 1.1-10,000. Note that a magnet-surface modifying gas is by definition a non-hydrogen containing gas.

The term "non-hydrogen containing gas" refers to a gas that substantially does not contain $H_2$ (or analogues thereof like $D_2$, $T_2$, HD, TD, HT). In an embodiment, the "non-hydrogen containing gas" has a $H_2$ content (including $H_2$ analogues) of less than about 10 ppm, or less than about 1 ppm, or in the range of about 10-0.001 ppm. In an embodiment, the term "non-hydrogen containing gas" also refers to a gas that does not contain H (or analogues thereof like D and T), and has a H content (including H analogues) of less than about 10 ppm, or less than about 1 ppm, or in the range of about 10-0.001 ppm.

The protective enclosure may further enclose one or more magnet protectors selected from the group of a hydrogen getter, a non-hydrogen containing gas and a magnet-surface modifying gas. Because the non-hydrogen containing gas may in an embodiment comprise the magnet-surface modifying gas, the protective enclosure may comprise one or more magnet protectors selected from the group of a hydrogen getter and a non-hydrogen containing gas.

In an embodiment, the protective enclosure may further comprise a detector arranged to detect leakage from a gas from the protective enclosure. Such a detector may be arranged outside from the protective enclosure, in order to measure whether gas from the protective enclosure is leaking to the external space from the protective enclosure. Such a detector may for instance be a mass spectrometer. The non-hydrogen containing gas or the magnet-surface modifying gas may comprise a gas chosen to facilitate detection, such as for instance a highly mobile, light gas, e.g. He or Ne, or another noble gas, that might relatively easily be detected chemically, spectroscopically or by a mass selective detector, etc.

In the above embodiments, the gas enclosed or fed to the protective enclosure may provide a substantially static embodiment or situation, in the sense that, for instance, only when the internal gas pressure drops under a certain predetermined pressure or pressure ratio (see also above), gas is added to the protective enclosure. However, in another embodiment, a substantially dynamic situation or embodiment may be created, wherein a gas flow through the protective enclosure is provided. Hence, in a specific embodiment, the protective enclosure further comprises an inlet for a non-hydrogen containing gas, and an outlet (for gas from the protective enclosure), and wherein the lithographic apparatus may further optionally comprise a controller arranged to control a flow of the non-hydrogen containing gas through at least part of the protective enclosure. Note that an outlet is an opening designed to allow gas escape from the protective enclosure, whereas leaks or cracks are openings which are not designed to allow gas escape but are openings which may develop during for instance production of the protective enclosure or during operation of the lithographic apparatus. In such an embodiment, the protective enclosure is purged with the non-hydrogen containing gas (which may, as mentioned above, include the magnet-surface modifying gas).

According to a further aspect, the invention provides a method for the protection of a magnet in a lithographic apparatus, the method comprising containing the magnet in a protective enclosure arranged to protect the magnet from contact with a hydrogen-containing gas, for instance by using the above and further herein described embodiments of the protective enclosure.

In an embodiment, the method for the protection of a magnet may comprise feeding a non-hydrogen containing gas (including a magnet-surface modifying gas) into the protective enclosure. In an embodiment, the method may comprise flowing a non-hydrogen containing gas (including a magnet-surface modifying gas) through at least part of the enclosure.

According to yet a further aspect, there is provided a device manufacturing method using a lithographic apparatus, wherein the lithographic apparatus comprises a magnet, and the method comprises containing the magnet in a protective enclosure arranged to protect the magnet from contact with a hydrogen-containing gas, wherein the hydrogen-containing gas is selected from the group consisting of a $H_z$-containing and a H-atom containing gas. The magnet is enclosed in a protective enclosure and protected according to above described embodiments.

In an embodiment, the lithographic apparatus comprises a source of radiation constructed to generate EUV radiation wherein the source of radiation is a Sn plasma source. Herein, the term "constructed to generate EUV radiation" especially refers to sources which are designed to generate EUV radiation and which are designed to be used in EUV lithography. In specific embodiments, the source of radiation comprises a laser produced plasma source (LPP source) or a discharge produced plasma source (DPP source), respectively.

In an embodiment, the lithographic apparatus comprises an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate. In an embodiment, the lithographic apparatus is an EUV lithographic apparatus. The lithographic apparatus comprises a source of radiation constructed to generate the radiation beam, which in an embodiment especially is a EUV radiation beam, and the source of radiation is constructed to generate EUV radiation.

In an embodiment, the magnet is a rare earth element containing magnet, such as a Nd or Sm containing magnet.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
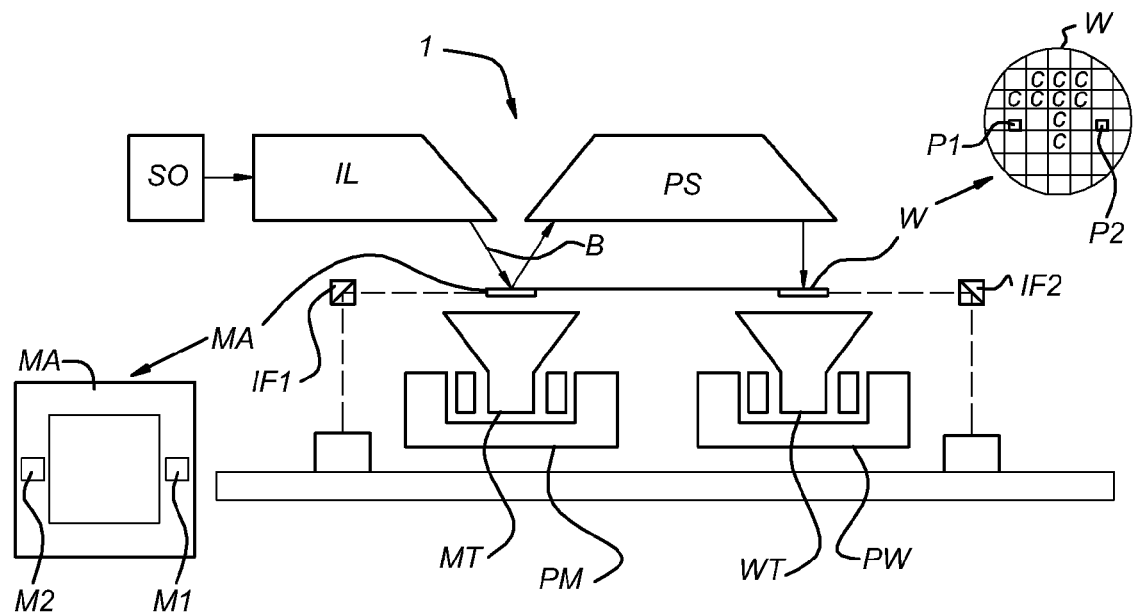
FIG. 1 schematically depicts a lithographic apparatus according to an embodiment of the present invention.

FIG. 1 schematically depicts a lithographic apparatus 1 according to an embodiment of the present invention. The apparatus 1 includes a source SO for generating radiation, an illumination system (illuminator) IL configured to condition a radiation beam B (e.g. UV radiation or EUV radiation) from the radiation received from source SO. The source SO may be provided as a separate unit. A support (e.g. a mask table) MT is configured to support a patterning device (e.g. a mask) MA and is connected to a first positioning device PM configured to accurately position the patterning device MA in accordance with certain parameters. A substrate table (e.g. a wafer table) WT is configured to hold a substrate (e.g. a resist-coated wafer) W and is connected to a second positioning device PW configured to accurately position the substrate W in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system, if desired, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

a. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

b. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

c. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

The terms "radiation" and "beam" used herein encompass all types of electromagnetic radiation, including ultraviolet (UV) radiation (e.g. having a wavelength λ, of 365, 248, 193, 157 or 126 nm) and extreme ultra-violet (EUV or soft X-ray) radiation (e.g. having a wavelength in the range of 5-20 nm, e.g. about 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, 5-20 nm relates to radiation with a certain wavelength band, of which at least part is in the range of 5-20 nm.

Figure 2:
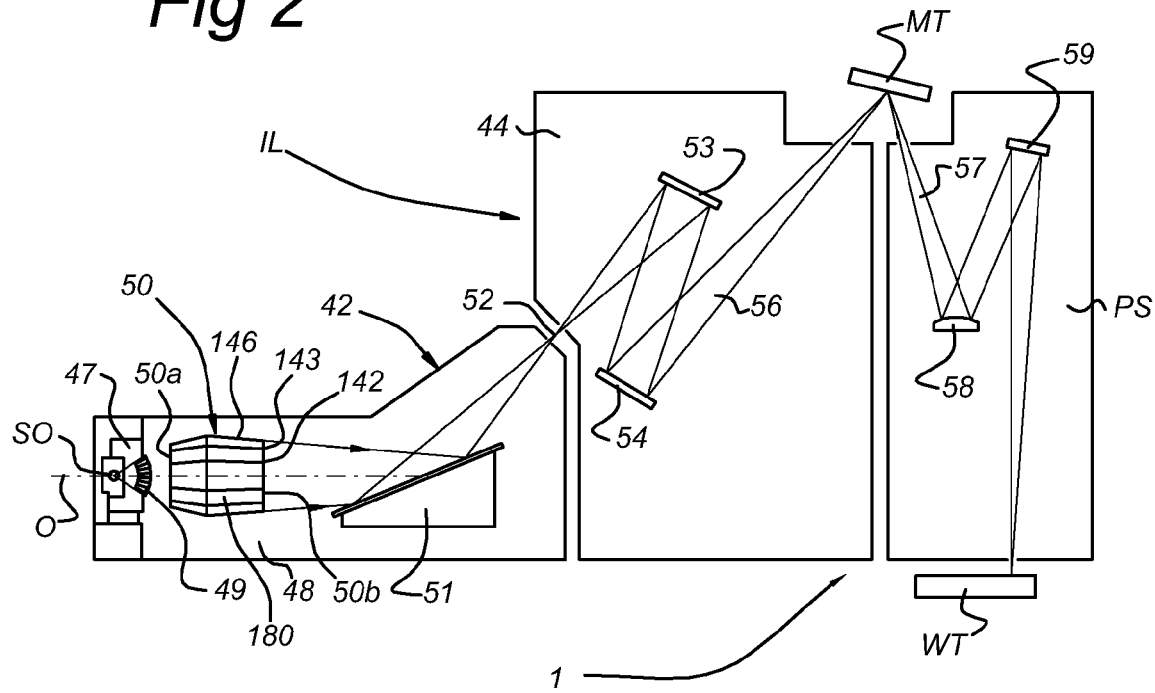
FIG. 2 schematically depicts a side view of an EUV illumination system and projection optics according to an embodiment of the lithographic apparatus of FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. In an embodiment, a tin (Sn) source as EUV source is applied. The radiation emitted by radiation source SO is passed from a source chamber 47 into a collector chamber 48 via an optional gas barrier or contaminant trap 49 (also indicated as contaminant barrier or foil trap) which is positioned in or behind an opening in source chamber 47. The contaminant trap 49 may comprise a channel structure. Contamination trap 49 may also comprise a gas barrier or a combination of a gas barrier and a channel structure. The contaminant trap or contaminant barrier 49 further indicated herein at least comprises a channel structure, as known in the art.

The collector chamber 48 includes a radiation collector 50 (herein also indicated as collector mirror) which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known from the prior art.

Instead of a grazing incidence mirror as collector mirror 50, also a normal incidence collector may be applied. Collector mirror 50, as described herein in an embodiment in more detail as nested collector with reflectors 142, 143, and 146, and as schematically depicted in, amongst others, FIG. 2 is herein further used as example of a collector (or collector mirror). Hence, where applicable, collector mirror 50 as grazing incidence collector may also be interpreted as collector in general and in a specific embodiment also as normal incidence collector.

Further, instead of a grating 51, as schematically depicted in FIG. 2, also a transmissive optical filter may be applied, or in an embodiment, no filter 51 may be used at all. Optical filters transmissive for EUV and less transmissive for or even substantially absorbing UV radiation are known in the art. "Grating spectral purity filter" is herein further indicated as "spectral purity filter" which includes gratings or transmissive filters. Not depicted in FIG. 2, but also included as optional optical element may be EUV transmissive optical filters, for instance arranged upstream of collector mirror 50, or optical EUV transmissive filters in illumination unit 44 and/or projection system PS.

In an embodiment (see also above), radiation collector 50 may be a grazing incidence collector. The collector 50 is aligned along an optical axis O. The source SO or an image thereof is located on optical axis O. The radiation collector 50 may include reflectors 142, 143, 146 (also known as a Wolter-type reflector comprising several Wolter-type reflectors). Sometimes they are also called shells. These reflectors (or shells) 142, 143, 146 may be nested and rotationally symmetric about optical axis O. In FIG. 2 (as well as in other Figures), an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Typically, this volume within outer reflector(s) 146 is circumferentially closed, although small openings may be present. All the reflectors 142, 143 and 146 include surfaces of which at least part includes a reflective layer or a number of reflective layers. Hence, reflectors 142, 143 and 146 (more reflectors may be present and embodiments of radiation collectors (also called collector mirrors) 50 having more than 3 reflectors or shells are comprised herein), are at least partly designed for reflecting and collecting EUV radiation from source SO, and at least part of the reflector may not be designed to reflect and collect EUV radiation. For example, at least part of the back side of the reflectors may not be designed to reflect and collect EUV radiation. The latter part may also be called back side. On the surface of these reflective layers, there may in addition be a cap layer for protection or as optical filter provided on at least part of the surface of the reflective layers.

The radiation collector 50 is usually placed in the vicinity of the source SO or an image of the source SO. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc. Reference number 180 indicates a space between two reflectors, e.g. between reflectors 142 and 143. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc. Reference number 180 indicates a space between two reflectors, e.g. between reflectors 142 and 143.

Figure 3:
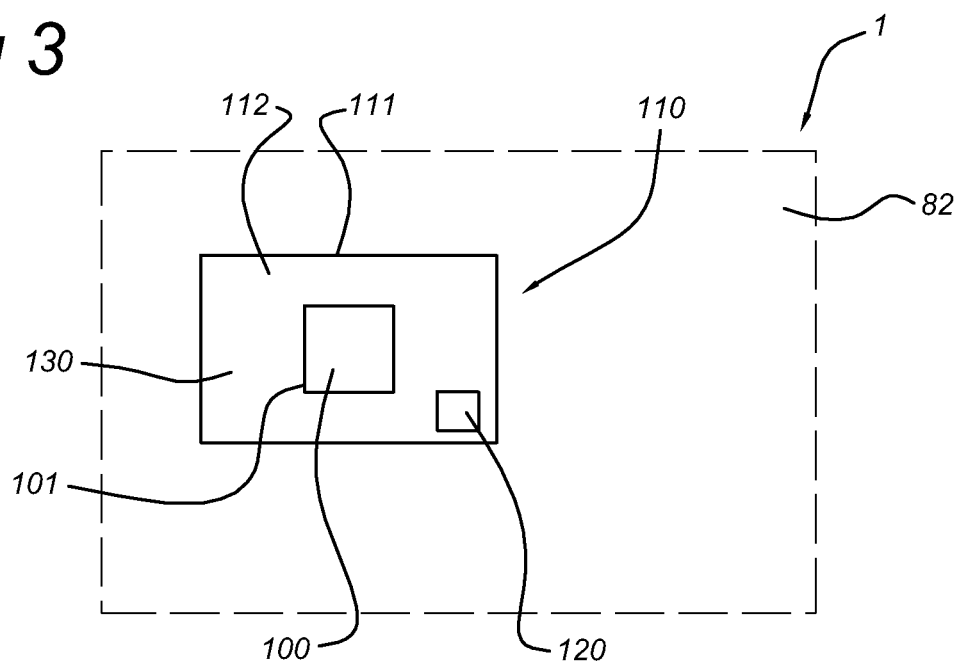
FIG. 3 schematically depicts an embodiment of a magnet enclosure in the lithographic apparatus of FIG. 1.

FIG. 3 schematically depicts a protective enclosure 110 enclosed by a lithographic apparatus 1. The lithographic apparatus 1 is indicated with the dashed enclosure, since anywhere in the lithographic apparatus magnets might be applied. Reference 82 refers to part of the lithographic apparatus interior, wherein a magnet 100 and a protective enclosure 110 are arranged. Reference 82 refers to the exterior of the protective enclosure 110 comprised by the lithographic apparatus 1.

Note that the term "a magnet" and "an enclosure" may also related to a plurality of magnets and a plurality of enclosures, respectively. For the sake of simplicity, only one magnet 100 in one protective enclosure 110 is herein schematically depicted, but the invention is not limited to such configuration.

The enclosure 110 has a wall 111, thereby enclosing the magnet 100 in a volume 112. The volume of the magnet 100 will in general be smaller than the volume 112 of the protective enclosure 110 (i.e. the volume enclosed by protective enclosure 110). The ratio of the enclosure volume 112 and the volume of the magnet 100 may be in the range of about 1.1-20, or in the range of about 1.1-10.

The enclosure volume 112 may comprise a gas 130. This gas may be a non-hydrogen containing gas. In an embodiment, the pressure in the enclosure volume 112 is in the vacuum range, such as in the range of about 0.001-0.1 Pa. The enclosure volume 112 may further comprise a hydrogen getter 120, such as for instance a rare earth metal like La, Nd, Sm, Gd, etc. The pressure within in the enclosures 110 may also be larger. In an embodiment, the pressure within the enclosure 110 may be in the range of about 0.001 Pa to above atmospheric, e.g. up to about 6 Bar.

In this way, lithographic apparatus 1 comprises magnet 100, the magnet 100 being contained in protective enclosure 110 and the protective enclosure 110 being arranged to protect the magnet 100 from contact with a $H_2$-containing or H-atom containing gas, which may be present in (at least part of) the lithographic apparatus interior 82. Since it is observed that $H_2$ and/or H may attack magnets 100, especially magnets that comprise rare earth elements such as Sm or La, etc., the protective enclosure 110 may be arranged to protect the magnet 100 from contact with a $H_2$-containing or H-atom containing gas that may be present in the lithographic apparatus 1 (i.e. part of the lithographic apparatus interior 82). This may provide a longer lifetime and/or better operation of the magnet 100 (i.e. protect the magnet 100). The use of the enclosure 110 may prevent or reduce attack by H radicals and/or $H_2$, and the surface of the magnet, indicated with reference 101, may be protected from attack by $H_2$ and/or H atoms (or H radicals).

In a specific embodiment, the non-hydrogen containing gas comprises a magnet-surface modifying gas. Especially suitable magnet-surface modifying gasses are $O_2$-containing gasses, such as $O_2$ or air, or water vapor. Such $O_2$-containing gasses may lead to attack of the magnet surface 101, thereby forming an oxide layer. Such an oxide layer may further protect the magnet 100 from H and/or $H_2$ attack. When the magnet-surface modifying gas, such as an $O_2$-containing gas, is present in the enclosure 110, reactions at the surface 101 may be oxidative.

Figure 4:
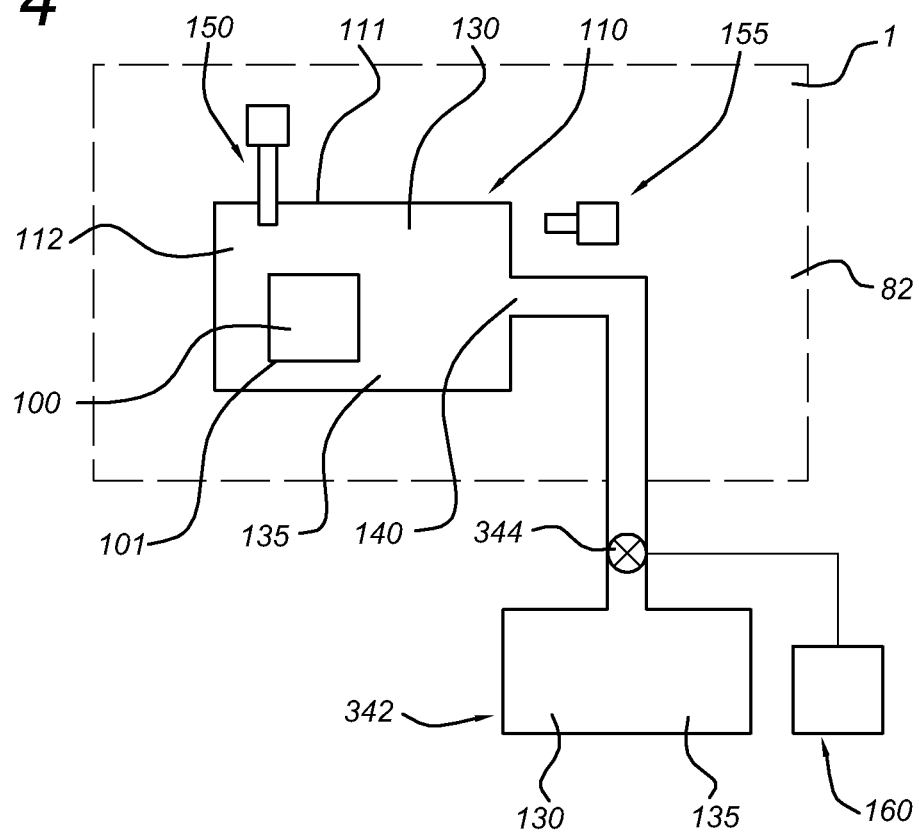
FIG. 4 schematically depicts an embodiment of a magnet enclosure in the lithographic apparatus of FIG. 1.

In FIG. 4, schematically an embodiment is depicted wherein the protective enclosure 110 comprises non-hydrogen containing gas 130. This gas may have a magnet surface modifying function, thereby being a magnet-surface modifying gas 135, but may also be another gas, not having surface modifying abilities. The non-hydrogen containing gas in FIG. 4 is indicated with reference 130. FIG. 4 schematically depicts an embodiment wherein the non-hydrogen containing gas 130 may be a magnet-surface modifying gas, indicated with reference 135.

In an embodiment, the protective enclosure 110 further comprises an inlet 140 for a non-hydrogen containing gas 130. Through inlet 140, gas 130 may be provided form a gas source 342. To this end, a pump or valve 344 may introduce gas 130 into protective enclosure 110. Again, the non-hydrogen containing gas 130 may comprise a magnet-surface modifying gas 135 (here schematically depicted). In an embodiment, the pump or valve 344 may be controlled by a controller 160, which may be for instance arranged to maintain a predetermined pressure of gas 130 (including optionally comprising magnet-surface modifying gas 135) in protective enclosure 110. To that end, the controller 160 may further receive an input signal of a sensor 150, arranged in an embodiment to measure the gas pressure in protective enclosure 110. Alternatively, or in combination with the sensor 150 arranged in an embodiment to measure the gas pressure in protective enclosure 110, the sensor 150 may (also) be arranged to sense the presence and/or measure the (partial) pressure of $H_2$ in the protective enclosure 110. In an embodiment, the controller 150 may be arranged to control a predetermined pressure of the non-hydrogen containing gas 130 in the protective enclosure 110 and/or may be arranged to sense the presence and/or measure the (partial) pressure of $H_2$ in the protective enclosure 110. In this way, for instance the atmosphere within the protective enclosure 110 can be maintained at a pressure which is higher than the pressure external from the protective enclosure (i.e. in lithographic apparatus volume 82). As mentioned above, the non-hydrogen containing gas 130 may in an embodiment also comprise magnet-surface modifying gas 135. The ratio of the internal protective enclosure pressure to the pressure external from the protective enclosure 110 may be larger than about 1, such as in the range of about 1.01-10,000, or in the range of about 1.1-10,000.

In an embodiment, the protective enclosure 110, or more precisely the lithographic apparatus 1, may further comprises a detector 155 arranged to detect leakage from a gas from the protective enclosure 110. The detector 155 may be arranged outside from the protective enclosure 110, in order to measure whether gas from the protective enclosure 110 is leaking to the external space 82 from the protective enclosure 110. The detector 155 may for instance be a mass spectrometer. To facilitate the detection, the non-hydrogen gas or magnet-surface modifying gas may comprise a gas chosen to facilitate detection, such as for instance a Ne, or another noble gas, that might relatively easily be detected chemically, or spectroscopically, or by a mass selective detector, etc. Controller 160 may also be arranged to receive a signal from sensor 155 and based on this signal control the input of non-hydrogen containing gas 130 to the protective enclosure 110 and/or the pressure of the non-hydrogen containing gas 130 in protective enclosure 110. Hence, in this way also a method is provided comprising feeding non-hydrogen containing gas 130 into the protective enclosure 110. As mentioned above, in an embodiment, non-hydrogen containing gas 130 comprises magnet-surface modifying gas 135.

Figure 5:
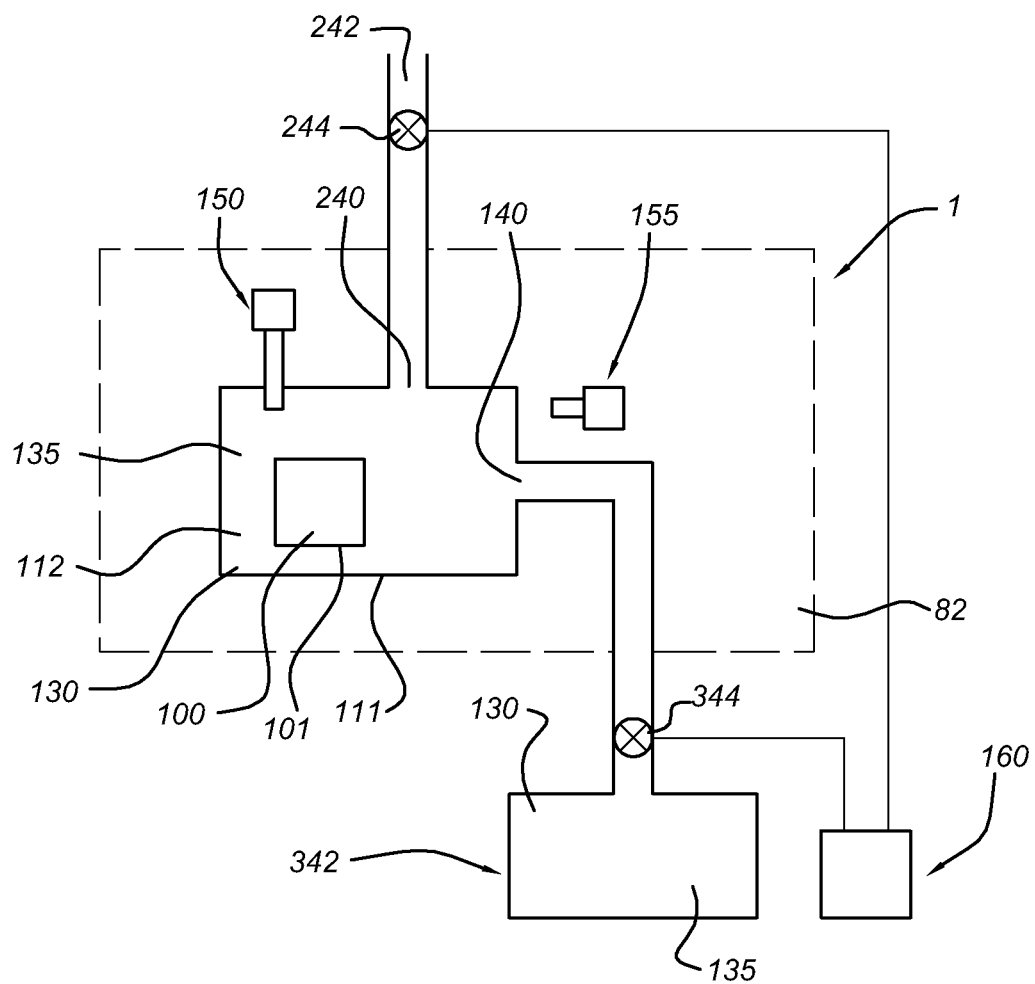
FIG. 5 schematically depicts an embodiment of the magnet enclosure in the lithographic apparatus of FIG. 1.

In another embodiment, a substantially dynamic situation or embodiment is created, wherein non-hydrogen containing gas 130 flows through the protective enclosure 110. Such embodiment is schematically depicted in FIG. 5. Here, the protective enclosure 110 further comprises inlet 140 for non-hydrogen containing gas 130 and an outlet 240. The lithographic apparatus 1 may further comprise controller 160 arranged to control a flow of the non-hydrogen containing gas 130 through at least part of the protective enclosure 110. The controller 160 may be arranged to control a volumetric flow rate of the flow, a mass flow rate of the flow, or both. In an embodiment, gas flows from gas source 342 through at least part of the protective enclosure 110 and leaves protective enclosure 110 at outlet 240. The lithographic apparatus 1 may further comprise a pump or valve 244, arranged to allow gas escape via outlet 240 from protective enclosure 110 to exhaust 242. In an embodiment, the controller 160 may be arranged to control valve or pump 344 and/or valve or pump 244, thereby allowing to maintain a predetermined pressure or flow, or both pressure and flow, of gas 130 in an through protective enclosure 110, respectively. Again, sensors 150 and or 155 may be applied. Thus, a protective method may comprise having the non-hydrogen containing gas 130 flow through at least part of the enclosure 110. As mentioned above, in an embodiment, non-hydrogen containing gas 130 comprises magnet-surface modifying gas 135. The ratio of the internal protective enclosure pressure to the pressure external from the protective enclosure 110 may be larger than about 1, such as in the range of about 1.01-10,000, or in the range of about 1.1-10,000. In this way, a purge flow configuration may be established so that the hydrogen content near the magnet 100 may be limited.

Embodiments described herein provide a lithographic apparatus 1 with a specific magnet protection. The lithographic apparatus 1 comprises magnet 100 being contained in a protective enclosure 110, the protective enclosure 110 being arranged to protect the magnet 100 from contact with a $H_2$-containing or H-atom containing gas. The enclosure may further contain the hydrogen getter 120 (shown in FIG. 3), and/or in an embodiment, the magnet-surface modifying gas 135, and/or contain another non-hydrogen containing gas 130. Further, a non-hydrogen containing gas flow may be provided or a magnet-surface modifying gas flow may be provided through at least part of the protective enclosure 110.

In an embodiment, a method for the protection of magnet 100 in lithographic apparatus 1 is provided, wherein the method comprises containing the magnet 100 in the protective enclosure 110 arranged to protect the magnet 100 from contact with $H_2$-containing or H-atom containing gas that may be present in the enclosure exterior 82, for instance by using the above and further herein described embodiments of the protective enclosure 110. Such a method may further comprise one or more protective measures selected from the group consisting of (a) providing the hydrogen-getter 120 to the protective enclosure 110, (b) feeding or flowing the non-hydrogen containing gas 130 to or into the protective enclosure 110, respectively, and (c) feeding or flowing the magnet-surface modifying gas 135 to or into the protective enclosure 110, respectively. In an embodiment, the ratio of the internal protective enclosure pressure to the pressure external from the protective enclosure 110 may be maintained larger than about 1, such as in the range of about 1.01-10,000, or in the range of about 1.1-10,000. In this way, the presence of the non-hydrogen containing gas 130 (including the magnet-surface modifying gas 135) may effectively reduce or even prevent introduction of hydrogen radicals and/or $H_2$ into the protective enclosure 110 (which hydrogen radicals and/or $H_2$ may be present in the lithographic apparatus surrounding the protective enclosure 110).

In an embodiment, the magnet is a rare earth (element) containing magnet, such as a Nd or a Sm containing magnet.

Embodiments disclosed herein also provide a device manufacturing method using the lithographic apparatus 1, wherein the lithographic apparatus 1 comprises the magnet 100, and the method comprises containing the magnet 100 in the protective enclosure 110 arranged to protect the magnet 100 from contact with a $H_2$-containing or H-atom containing gas that may be present in the enclosure exterior 82.

The Figures depict a number of possible embodiments, to which the invention is not limited. The magnet 100 may be protected by one or more magnet protectors selected from the group of the hydrogen getter 120, the non-hydrogen containing gas 130 and the magnet-surface modifying gas 135, and that when using a gas, the protective enclosure may be arranged to provide a flow of the non-hydrogen containing gas 130 and/or a flow of the magnet-surface modifying gas 135.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein. This computer program may be used to control the removal of the deposition, control the pressures, etc.

The descriptions above are intended to be illustrative, not limiting. Thus, it will be apparent to one skilled in the art that modifications may be made to the present invention as described without departing from the scope of the claims set out below. Use of the verb "to comprise" and its conjugations does not exclude the presence of elements or steps other than those stated in a claim. The article "a" or "an" preceding an element does not exclude the presence of a plurality of such elements.

The present invention is not limited to application of the lithographic apparatus or use in the lithographic apparatus as described in the embodiments. Further, the drawings usually only include the elements and features that are necessary to understand the present invention. Beyond that, the drawings of the lithographic apparatus are schematic and not on scale. The present invention is not limited to those elements, shown in the schematic drawings (e.g. the number of mirrors drawn in the schematic drawings). Further, the present invention is not confined to the lithographic apparatus described in relation to FIG. 1. The present invention described with respect to a radiation collector may also be employed to (other) multi-layer, grazing incidence mirrors or other optical elements. It should be appreciated that embodiments described above may be combined.

The invention claimed is:

1. A lithographic apparatus comprising:
   at least one chamber having an interior space;
   a magnet; and
   a protective enclosure, the magnet being contained in the protective enclosure and the protective enclosure being arranged to protect the magnet from contact with a hydrogen-containing gas present in the interior space,
   wherein the hydrogen-containing gas comprises one or more gasses selected from the group consisting of a $H_2$-containing gas and an H-atom containing gas, and
   wherein the protective enclosure further encloses one or more magnet protectors selected from the group of a hydrogen getter, a non-hydrogen containing gas, and a magnet-surface modifying gas.

2. The lithographic apparatus according to claim 1, wherein the magnet is a rare earth containing magnet.

3. The lithographic apparatus according to claim 1, further comprising
   an illumination system configured to condition a radiation beam;
   a support constructed to support a patterning device, the patterning device being capable of imparting the radiation beam with a pattern in its cross-section to form a patterned radiation beam; and
   a projection system configured to project the patterned radiation beam onto a target portion of a substrate.

4. A method for the protection of a magnet in a lithographic apparatus, the method comprising:
   containing the magnet in a protective enclosure arranged to protect the magnet from contact with a $H_2$-containing or H-atom containing gas; and
   enclosing one or more magnet protectors selected from the group of a hydrogen getter, a non-hydrogen containing gas, and a magnet-surface modifying gas in the protective enclosure.

5. The method according to claim 4, wherein said enclosing one or more magnet protectors comprises feeding the non-hydrogen containing gas and/or the magnet-surface modifying gas into the protective enclosure.

6. The method according to claim 4, further comprising flowing the non-hydrogen containing gas and/or the magnet-surface modifying gas through at least part of the protective enclosure.

7. A device manufacturing method using a lithographic apparatus, the lithographic apparatus comprising a magnet, the method comprising:
   projecting a patterned beam of radiation onto a target portion of a substrate;
   containing the magnet in a protective enclosure arranged to protect the magnet from contact with a $H_2$-containing or H-atom containing gas; and
   enclosing one or more magnet protectors selected from the group of a hydrogen getter, a non-hydrogen containing gas and a magnet-surface modifying gas in the protective enclosure.

* * * * *

UNITED STATES PATENT AND TRADEMARK OFFICE
CERTIFICATE OF CORRECTION

PATENT NO. : 8,446,560 B2
APPLICATION NO. : 12/735823
DATED : May 21, 2013
INVENTOR(S) : Johannes Hubertus Josephina Moors et al.

It is certified that error appears in the above-identified patent and that said Letters Patent is hereby corrected as shown below:

On title page, Item (75) Inventors, Line 3
      replace "Erik Roelo"
      with --Erik Roelof--.

Signed and Sealed this
Twenty-third Day of July, 2013

Teresa Stanek Rea
*Acting Director of the United States Patent and Trademark Office*